(12) United States Patent
Schmitz et al.

(10) Patent No.: US 6,313,512 B1
(45) Date of Patent: Nov. 6, 2001

(54) LOW SOURCE INDUCTANCE COMPACT FET TOPOLOGY FOR POWER AMPLIFIERS

(75) Inventors: Norbert A. Schmitz, Roanoke; Victor G. Abbott, Catawba, both of VA (US)

(73) Assignee: Tyco Electronics Logistics AG, Steinach (CH)

( * ) Notice: Subject to any disclaimer, the term of this patent is extended or adjusted under 35 U.S.C. 154(b) by 0 days.

(21) Appl. No.: 09/257,119

(22) Filed: Feb. 25, 1999

(51) Int. Cl.⁷ .................................................. H01L 29/76
(52) U.S. Cl. ...................... 257/401; 257/341; 257/342; 257/365
(58) Field of Search ................................. 257/341, 342, 257/365, 270, 275, 536, 776, 410, 401; 438/193, 195, 284, 382, 280

(56) References Cited

U.S. PATENT DOCUMENTS

| | | | |
|---|---|---|---|
| 3,586,930 | 6/1971 | Das et al. ............................. | 317/235 |
| 4,847,212 | * 7/1989 | Balzan et al. ........................ | 437/41 |
| 5,021,844 | 6/1991 | Wataze et al. ....................... | 357/23.3 |
| 5,057,882 | 10/1991 | Pritchett .............................. | 357/22 |
| 5,614,762 | * 3/1997 | Kanamori et al. ................... | 257/69 |
| 5,652,452 | * 7/1997 | Asano .................................. | 257/341 |
| 5,737,041 | 4/1998 | Holmberg et al. .................. | 349/43 |
| 5,818,077 | 10/1998 | Takahashi et al. .................. | 257/276 |
| 5,925,901 | * 7/1999 | Tsutsui ................................ | 257/276 |
| 6,020,613 | * 2/2000 | Udomoto et al. ................... | 257/341 |

* cited by examiner

*Primary Examiner*—Olik Chaudhuri
*Assistant Examiner*—Nathan W. Ha
(74) *Attorney, Agent, or Firm*—Arthur L. Plevy; Duane, Morris & Hecksch

(57) ABSTRACT

A field effect transistor (FET) comprising a plurality of drain finger electrodes, source finger electrodes and gate finger electrodes disposed in an active region of a semiconductor substrate; a drain bus disposed outside the active region and electrically connecting the drain finger electrodes to each other; a gate bus disposed outside the active region and electrically connecting the gate finger electrodes to each other; and a source bus disposed outside the active region and electrically connecting the source finger electrodes to each other; wherein the drain fingers are electrically connected to each other via the drain bus without crossing over the source or gate fingers.

25 Claims, 10 Drawing Sheets

RF SINGLE GATE FET
DIMENSIONS

|  | SINGLE GATE (IN μm) |
|---|---|
| GAT | |
| GAT | 1.6 |
| GAT-GAT | N/A |
| IMPLANT-FLARE | 5.2 |
| GAT EXTENSION | 1.8 |
| FALRE EXTENSION | 3.4 |
| FLARE SIZE | 3.2 |
| ISI + SELECTIVE IMPLANT | |
| ISI + SELECTIVE IMPLANT | 3.0 |
| OHM | |
| OHM CHANNEL SPACING | 3.6 |
| GAT-OHM (DRAIN) | 1.8 |
| GAT-OHM (SOURCE) | 1.8 |
| MT1 | |
| MT1 GAT OVERLAY | 0.8 |
| MT1 | 4.0 |
| MT1-OHM | 1.0 |
| NVA | |
| NVA | 2.0 |
| NVA-OHM | 4.0 |
| PLG | |
| PLG | 6.0 |
| PLG-OHM | 2.0 |

*FIG. 5B*

LOW SOURCE INDUCTANCE COMPACT FET TOPOLOGY FOR POWER AMPLIFIERS

FIELD OF THE INVENTION

This invention relates to field effect transistors (FETs), and more specifically to radio frequency power amplifier FETs designed for minimum source inductance.

BACKGROUND OF THE INVENTION

In high frequency (e.g. microwave) applications, through wafer via holes are used for grounding purposes so as to effectively distribute the ground connections throughout the device. That is, through wafer vias operate to distribute as much as possible the ground signal connections throughout the whole device. However, in low frequency applications, (e.g. under 2.5 Ghz) such grounding typically occurs via bond wires which connect to the package of an IC chip. In designing field effect transistors (FETs) for applications where frequencies are low (e.g. <2.5 GHz) and through-wafer vias are not used due to cost reasons, manufacturers optimize the FET topology for minimum source inductance. An example of this type of prior art device is the Philips CGY2030 3 volt, 0.5 watt 1900 MHz radio frequency power amplifier shown in FIG. 1.

This optimization results in a configuration where the source fingers 30' lead directly to the edge of the chip where bond wires connect the source fingers directly to ground without an on-chip bus, in an attempt to minimize source inductance. The gate fingers 40' are bussed and center-fed. The drain fingers 50' are also bussed together and cross over both the source and gate connections.

It is well known that drain lines and source lines carry large currents. Accordingly, handling these large currents requires relatively thick metallization layers. Unfortunately, thick metal traces cannot be patterned to very fine dimensions. Because of these large dimensions, making a bus connection that crosses over a thick metal requires a large space. These spaces and large connections end up determining the minimum gate finger spacing. In the prior art, the gate finger spacing is typically around 15–20 μm. As illustrated in the prior art FIGS. 1 and 2, the drain lines undesirably cross over both the source and gate fingers. That is, as shown in FIG. 2, the drain fingers 50' are coupled to the drain bus 80' so that the drain, gate, and source lines cross over one another within the active region 101' of the FET device. These crossover areas are illustrated as reference numeral 75' and 77'. Accordingly, it is highly desirable to obtain a FET cell topology which eliminates crossover of the large current drain lines with the source and gate lines so as to reduce the gate finger spacing, as well as the overall size of the semiconductor device.

This invention eliminates the need to cross the drain lines over the source lines. By doing so, gate finger spacing no longer depends on design rules for thick metallization. This allows a much more compact FET layout which advantageously permits gate to gate spacing to be reduced by approximately 30% to 50% (8.6 to 12 μm) from the current gate to gate spacings.

SUMMARY OF THE INVENTION

A field effect transistor (FET) comprising a plurality of drain finger electrodes, source finger electrodes and gate finger electrodes disposed in an active region of a semiconductor substrate; a drain bus disposed outside the active region and electrically connecting the drain finger electrodes to each other; a gate bus disposed outside the active region and electrically connecting the gate finger electrodes to each other; and a source bus disposed outside the active region and electrically connecting the source finger electrodes to each other; wherein the drain fingers are electrically connected to each other via the drain bus without crossing over the source or gate fingers.

There is also disclosed a method of forming a field effect transistor comprising the steps of disposing a doped layer onto the top surface of the substrate, and wherein the step of forming a plurality of drain finger electrodes, source finger electrodes and gate finger electrodes within said active region comprises disposing an ohmic metal layer over a portion of the doped layer; and a first metal layer onto the ohmic metal layer to form the drain finger electrodes; disposing a gate metal layer over another portion of the doped layer; and a first metal layer onto the gate metal layer to form the gate finger electrodes; and disposing an ohmic metal layer over a third portion of the doped layer; and a first metal layer onto the ohmic metal layer to form the source finger electrodes.

BRIEF DESCRIPTION OF THE DRAWINGS

FIG. 5B provides dimensions associated with major features of the single gate FET layout shown in FIG. 5A.

DETAILED DESCRIPTION OF THE INVENTION

Figure 1:
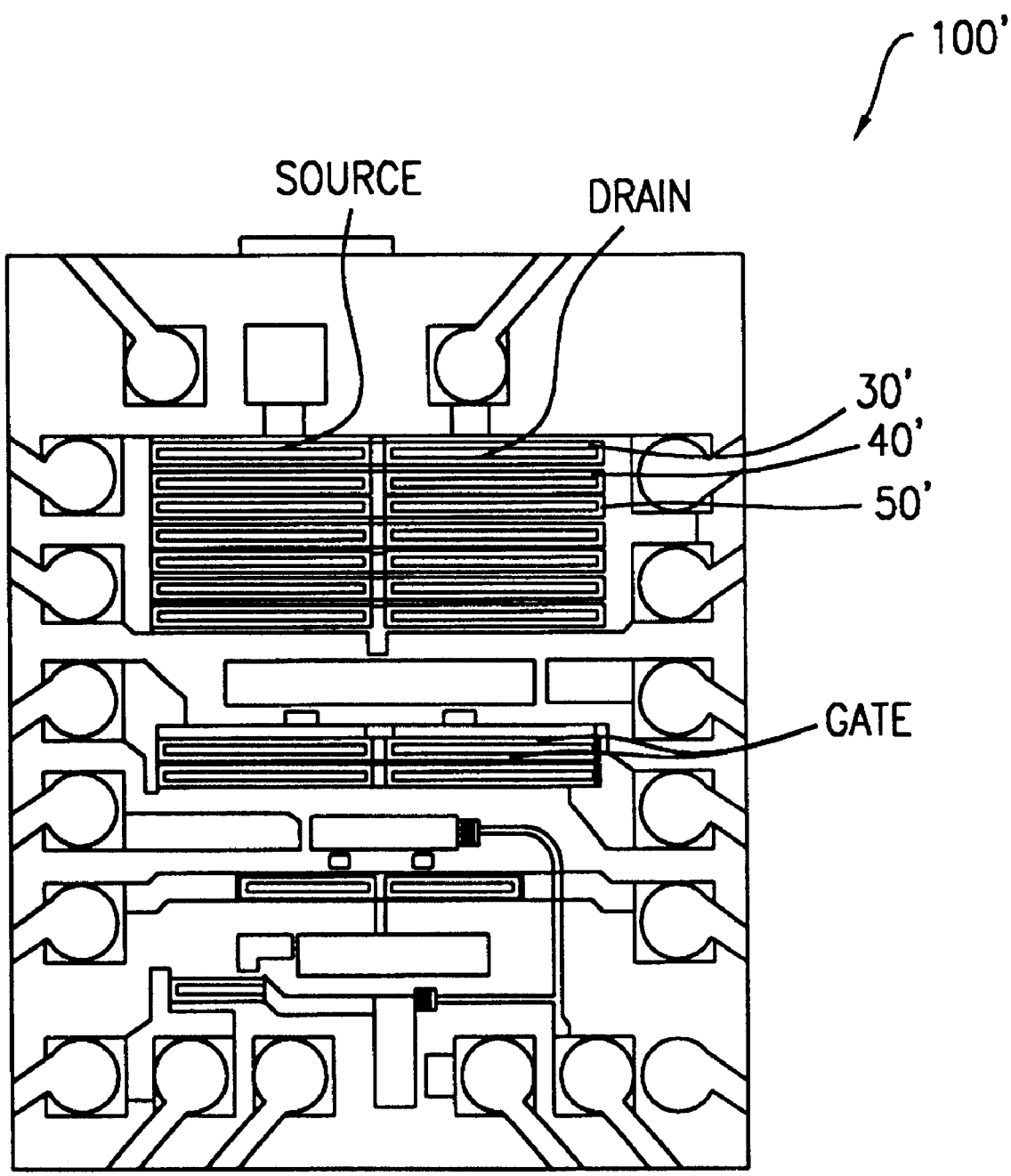
FIG. 1 is an illustration of a semiconductor device employing a prior art topology wherein drain fingers are bussed together and cross over both source and gate connections.
Figure 2:
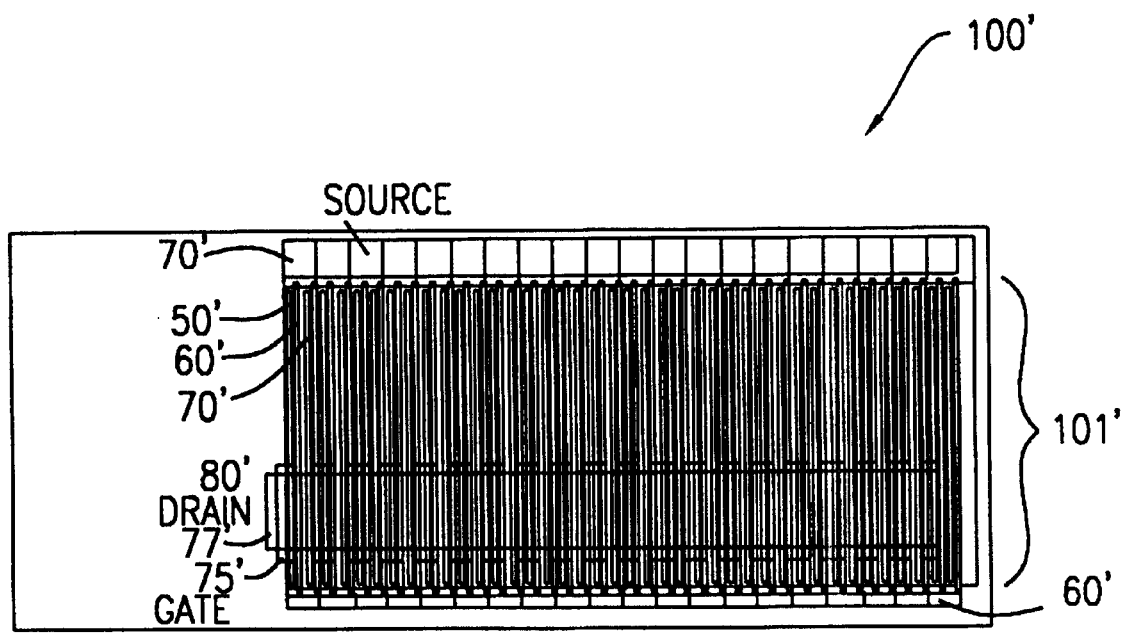
FIG. 2 is a schematic illustration of the prior art topology of a FET having a source, gate and drain wherein the drain fingers cross over both the source and gate connections within the active area of the semiconductor device.
Figure 3:
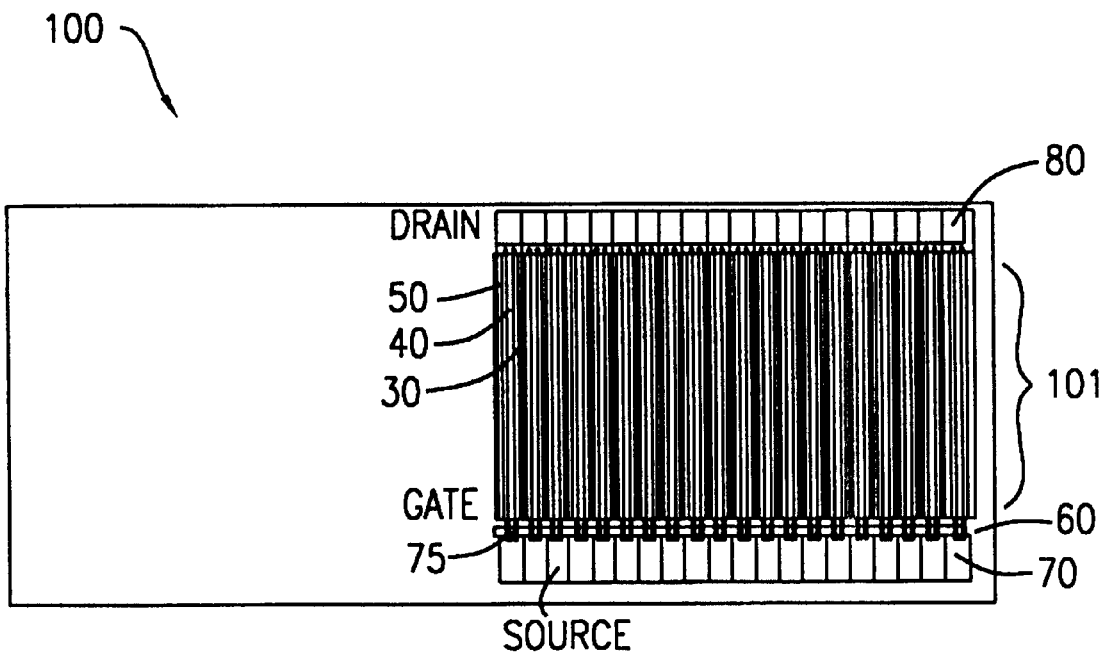
FIG. 3 is a schematic representation of the FET cell topology according to the present invention, wherein the drain and source finger cross over is eliminated within the active area of the semiconductor device.

Before embarking on a detailed discussion, the following should be understood. In the current state of the art, as illustrated in FIGS. 1 and 2, drain lines cross over source lines thereby requiring relatively large gate finger spacing (typically minimum of 15–20 μm) and thereby increasing the size and potential cost of the FET devices. In the present invention, as illustrated in FIG. 3, a compact FET device 100 is provided where source fingers 30 connected to source bus 70 cross over a gate bus 60. Since the gate lines or gate fingers 40 carry very little current, the connections may be made using a relatively thin metal. The drain finger electrodes 50 can be bussed together via drain bus bar 80, as shown at the top portion of FIG. 3, without crossing over any other FET terminal. This avoids the large and costly crossovers of drains and sources.

Referring now to FIG. 3, there is shown a plan view of the compact FET cell topology according to the present invention. A field effect transistor (FET) 100 is shown which comprises a plurality of drain finger electrodes 50, source finger electrodes 30, and gate finger electrodes 40 disposed in an active region 101 of a semiconductor 90 (see FIG. 6). A drain bus bar 80 is disposed outside the active region 101 of the FET and operates to electrically connect each of the drain fingers 50 to one another. The drain bus extends along virtually the entire width of the FET active area, which is substantially rectangular in shape, in order to electrically couple each of the corresponding drain fingers. The source bus bar 70 is also disposed outside the active region, extending along virtually its entire width and operates to electrically connect each of the finger electrodes to one another. The source bus is disposed opposite to the drain bus such that the drain source and gate finger electrodes within the active region extend between the respective drain and source busses. Gate bus bar 60 is also disposed between the drain and source busses proximal to the source bus. Gate bus bar 60 operates to electrically couple each of the corresponding gate fingers 40 to one another. Note that in the preferred embodiment, through wafer via holes are not used. Instead, bond wires connect the busses to pads on an IC chip package (not shown) for electrical communication. Crossover regions 75 illustrate the locations within the FET 100 where the sources cross over the gate bus.

As shown in FIG. 3, each of the gate fingers is interposed between a corresponding one of the source and drain fingers, such that for a given gate finger electrode, a corresponding source finger and drain finger are positioned adjacent to the particular gate finger.

Figure 4A:
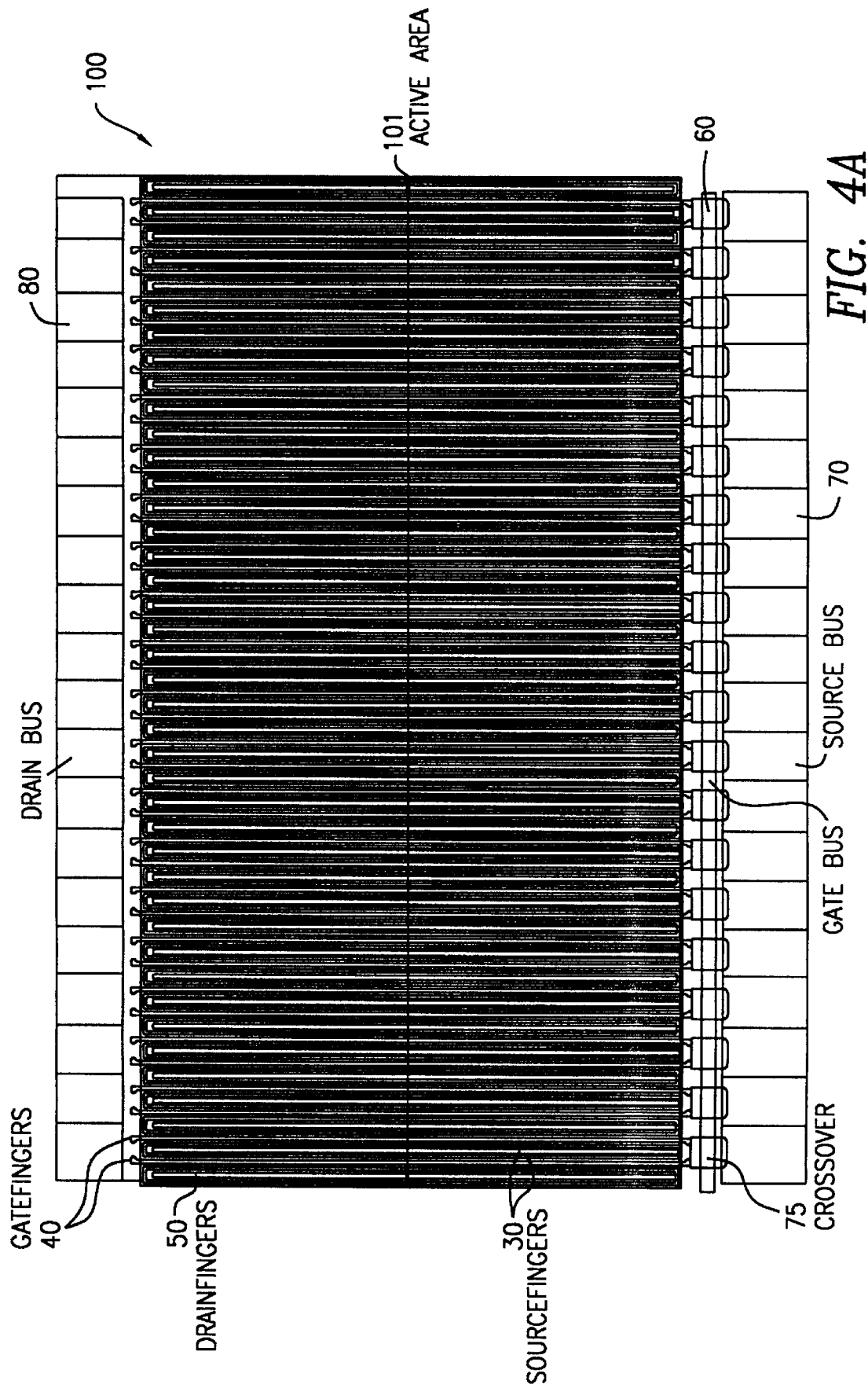
FIG. 4A represents an exploded view of the FET cell topology shown in FIG. 3 illustrating the drain, gate, and source regions according to the present invention.
Figure 4B:
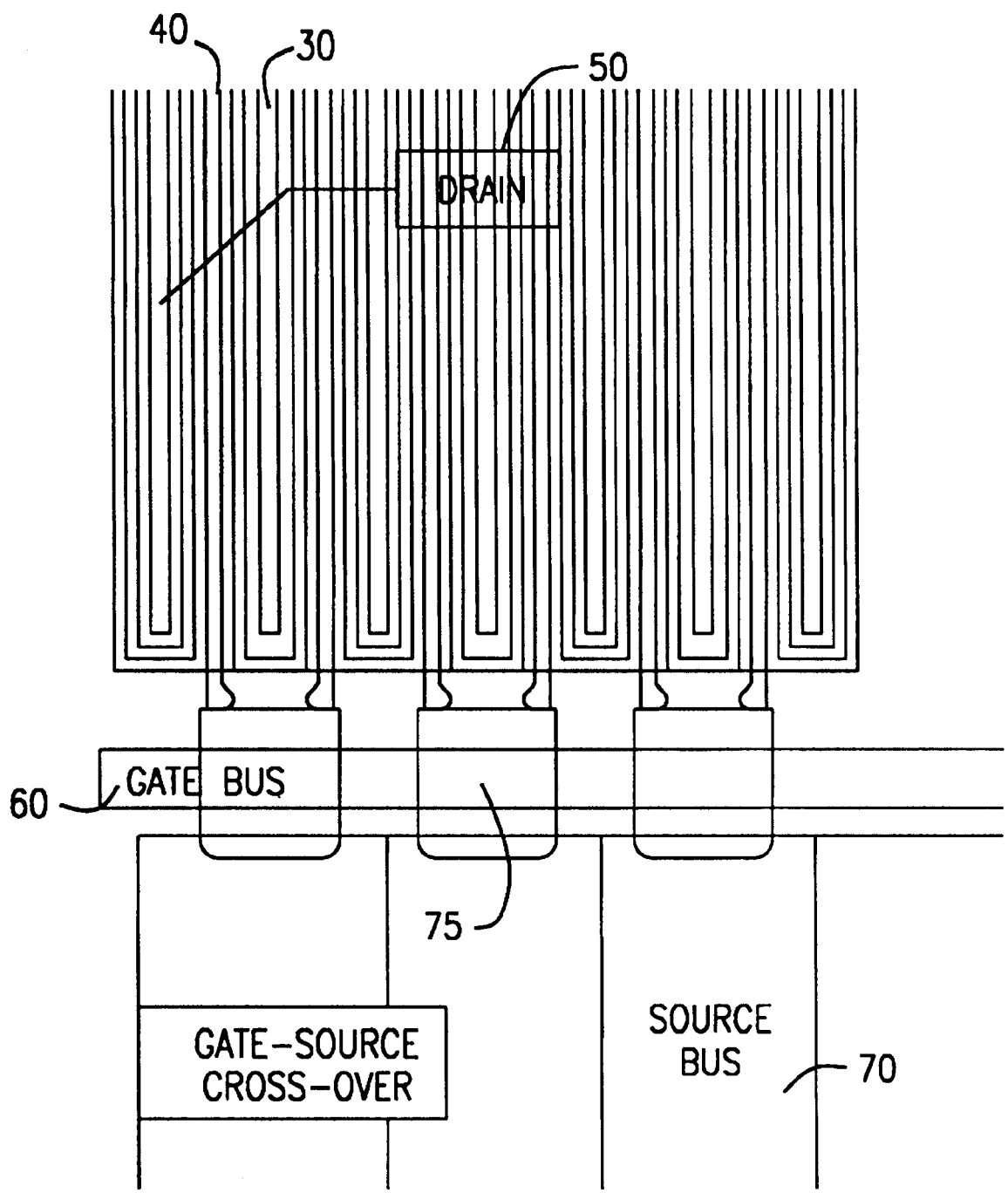
FIG. 4B represents a more detailed view of the FET cell topology of FIGS. 3 and 4A illustrating the drain, gate, and source finger electrodes and the crossover region of the source and gate bus according to the present invention.

As best illustrated in FIG. 4B, reference numeral 75 illustrates the gate source crossover region, wherein the gate bus 60 is disposed beneath the source 70. Note that as best shown in FIG. 4A, the drain fingers are electrically connected to each other via the drain bus without crossing over any source or gate finger electrodes within the active region of the FET.

Figure 6:
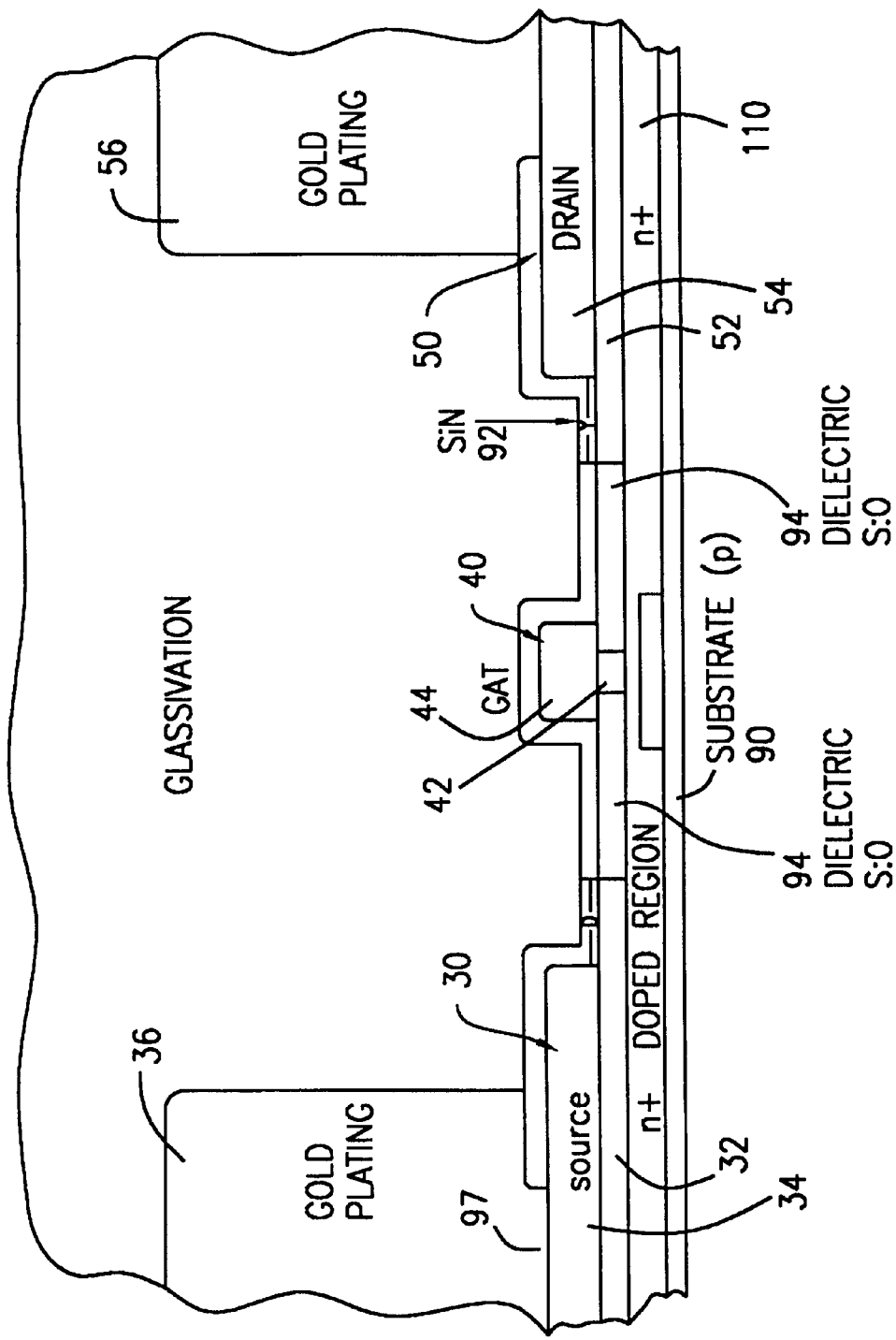
FIG. 6 is a cross-sectional view of a semiconductor device employing the topology according to the present invention.
Figure 7:
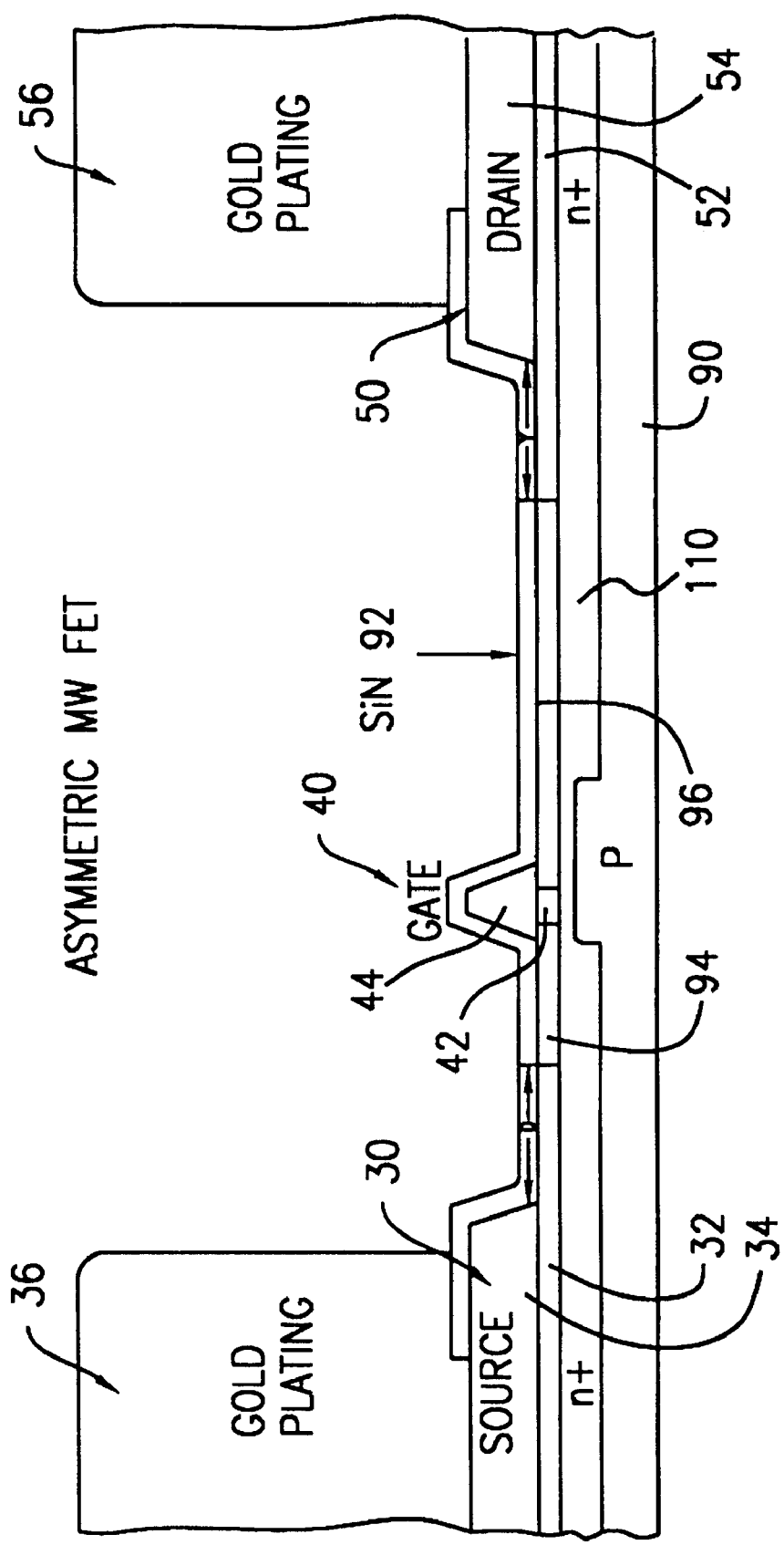
FIG. 7 is a cross-sectional view of an asymmetric microwave FET employing the topology according to the present invention.

FIG. 6 illustrates a cross-sectional view of the FET illustrated in FIGS. 3 and 4A–4B. FIG. 6 shows a symmetrical FET structure, while FIG. 7 illustrates an asymmetrical microwave FET employing the topology of the present invention. As can be seen from FIG. 6 (or FIG. 7), a doped n+layer is formed on a p-type GaAs semiconductor substrate 90 for forming the active region. (Note that the hump shown in the substrate is a non-physical representation of the substrate doping.) Still referring to FIG. 6, the drain finger electrodes 50 are formed on the active region and comprise an ohmic metal layer 52 disposed on the n+doped region 110 and a first metal layer 54 (MT1) disposed on top of the ohmic metal layer. The ohmic metal layer 52 is formed of a Ni/Ge/Au metal, while the first metal layer comprises a Ti/Ge/Au layer of metal.

In similar fashion, each source finger electrode 30 comprises an ohmic layer 32 which covers a portion of the n+ doped region 110 and upon which is disposed first metal layer 34 (MT1). Preferably, the ohmic and metal layers are formed of the same material as discussed in the drain finger electrode discussion, namely Ni/Ge/Au and Ti/Ge/Au. Gate finger electrode 40 is disposed between the drain and source finger electrodes and comprises a titanium tungsten nitride (TiWN) gate metal layer 42 on top of which is formed a first metal layer 44 (MT1) of Ti/Ge/Au alloy used to reduce resistance. A silicon dielectric layer 94 is formed between the ohmic metal layers of the respective source and drain fingers of the gate finger electrode 40 to provide electrical isolation. An insulating layer 92 of silicon nitride (SiN) is deposited on the top surface of each of the gate, source, and drain finger electrodes and extends uniformly across the entire drain, source and gate finger region. Nitride via holes (NVA) 97 are formed in insulating layer 92 at drain and source fingers 50 as to electrically couple the first metal layer (34, 54) with a plated gold conductive layer (36, 56) disposed over the insulating layer.

As one can see from the drawing of FIG. 6, each of the ohmic layers (34, 54) of the respective source and drain finger electrodes extend a distance (D,Y) beyond the edge of their respective first metal layers (34, 54). This relationship is also illustrated in FIG. 5A which represents a more detailed top view illustrating a single gate FET layout incorporating the compact FET topology according to the present invention.

Figure 5A:
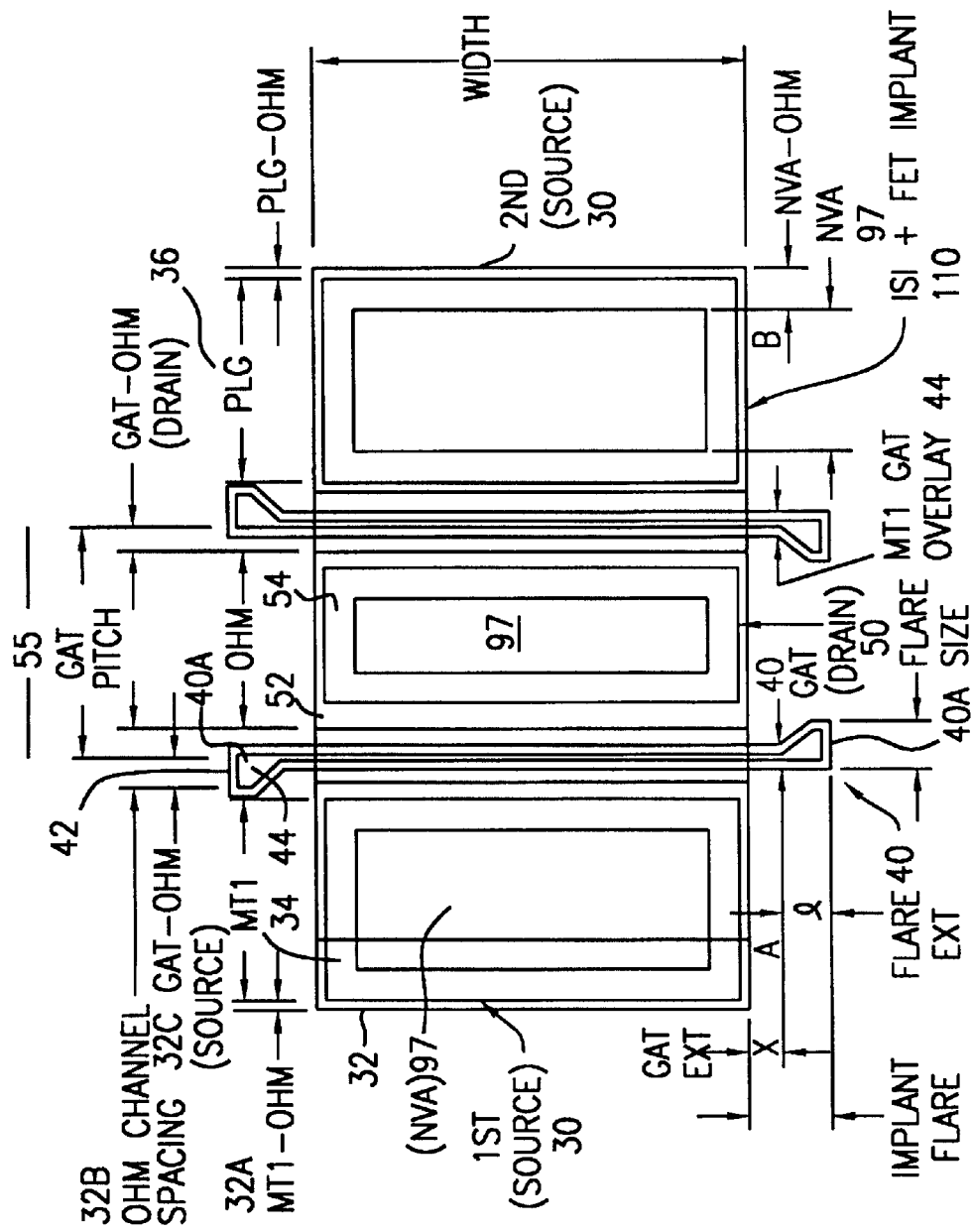
FIG. 5A is a top view of a microwave single gate finger FET layout according to the present invention.

Referring to FIG. 5A, there is shown a single gate FET layout, where the source, gate and drain fingers are repetitiously interleaved, such that each gate finger 40 (GAT) is adjacent a corresponding drain finger 50 and source finger 30. Source finger 30 comprises ohmic layer 32 on top of which metal layer 34 (MT1) is formed. The ohmic layer extends beyond the boundaries of the MT1 layer a predetermined distance identified as MT1-OHM 32A. The ohmic channel spacing 32B defined between the end of the ohmic layer 32 of a source finger electrode and extending across the gate finger electrode and ending at the beginning of the drain finger electrode ohmic layer 52, is in the preferred embodiment, approximately 3.6 μm. The GAT-OHM region 32C, which begins at the edge of the ohmic layer 32 and extends across the majority of the gate finger electrode 40, has a width of substantially 1.8 μm. As shown in FIG. 5A, the gate finger electrode 40 includes flared end portions 40A and includes gate metal layer 42 comprising titanium tungsten nitride TiWN. The gate finger electrode width is substantially 1.6 μm, while the flare size is substantially twice the size of the longitudinal extending portion and is approximately 3.2 μm. The flare extension portion has a length L of approximately 3.4 μm. The gate fingers extend a distance X beyond the source and drain fingers defining a gate extension distance of approximately 1.8 μm. The drain finger electrode 50 is disposed adjacent the gate finger 40 and opposite source finger 30 and comprises the ohmic metal layer 52 and first metal (MT1) layer 54. The ohmic metal layer as shown in this embodiment is approximately 6 μm wide. The gate-to-gate spacing 55 is represented by the ohmic metal layer width and the ohmic channel spacing for each gate finger. Thus, in the present embodiment, the gate-to-gate spacing is substantially 6.0+3.6=9.6 μm, which is significantly less than the 15–20 μm gate-to-gate spacings currently implemented in industrial FET applications.

FIG. 5A further shows a second gate finger disposed between the drain finger and a second source finger. The second source finger illustrates the plated gold layer 36

(PLG) disposed on top of the MT1 layer for each of the source and drain finger electrodes. The ISI and FET implant region representative of doped region 110 is also shown in FIG. 5A, extending between points A and B across the FET device. This implant region can be considered coincident with the MT1 layer and the gate, source, and drain finger electrodes. FIG. 5B illustrates dimensions associated with each of the major features of the single gate FET layout, as shown in FIG. 5A.

Figure 8:
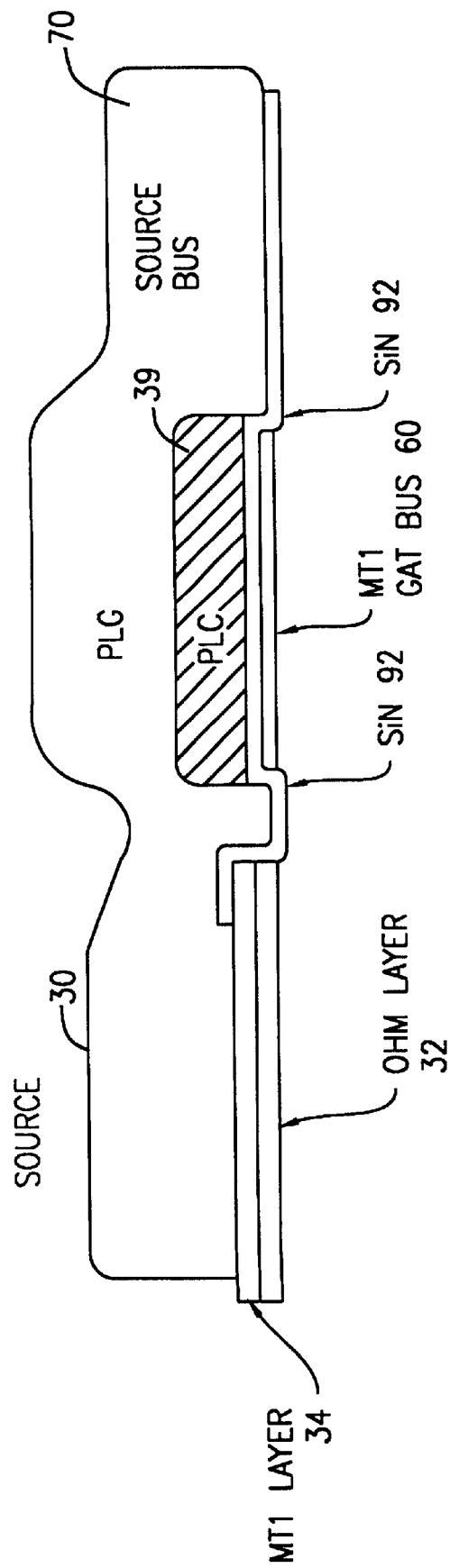
FIG. 8 illustrates a cross-sectional view of the source-to-gate crossover region according to the present invention.

Referring now to FIG. 8, in conjunction with FIGS. 3 and 4A–B, there is depicted a cross-sectional view of the cross-over region 75 between the gate bus 60 and source bus 70 connecting the source fingers 30 to one another. It should be noted that FIG. 8 represents a cross sectional view of the FET rotated by ninety degrees from the cross sectional view shown in FIG. 6. As shown in FIG. 8, the gate bus 60 is separated from the source bus and source fingers by a polyimide crossover layer 39 used for low capacitance cross over. Silicon nitride insulating layer 92 is disposed between the gate bus and the polyimide crossover. The polyimide crossover layer is approximately 6 $\mu$m thick (validate this), and 12 $\mu$m in width (validate this). The polyimide crossover geometry defines the low capacitance crossover locations, and is used for any PLG/MT1 metal crossovers which occur outside transistor capacitor and inductor cells.

As previously mentioned, such polyimide crossover is not necessary for the drain finger and drain bus as a result of the FET layout according to the present invention. Note also that as shown in FIG. 8, the source bus 70 is made of plating gold comprising a TiWN/Ti/Au metal alloy, as are the gate bus 60 and the drain bus 80. By eliminating the need to cross the drain fingers and drain bus 80 over the source lines (and source bus 70), the gate finger spacings may be reduced, thereby providing a more compact FET layout.

Figure 9A:
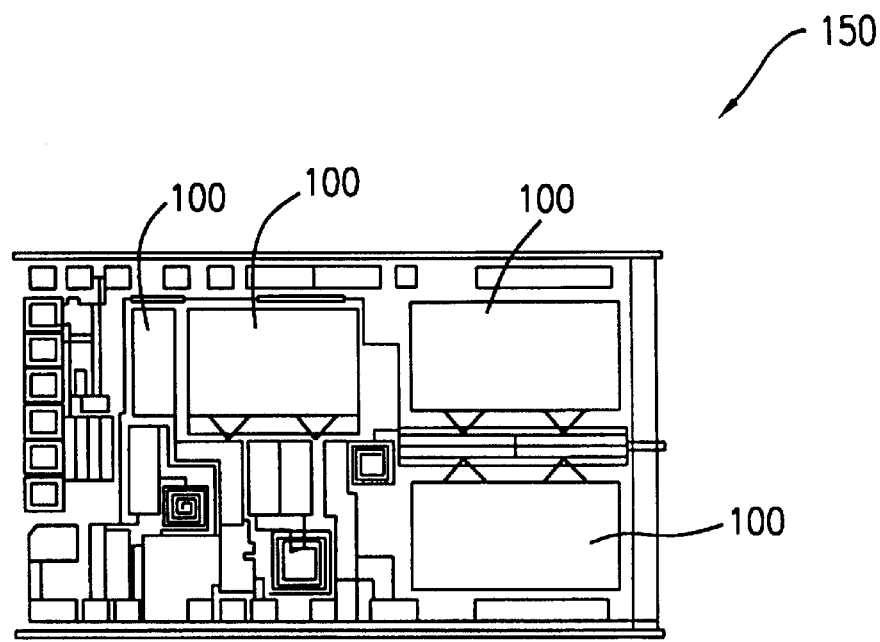
FIG. 9A illustrates an exemplary view of a power amplifier integrated circuit laid out using the FET cell topology according to the present invention.
Figure 9B:
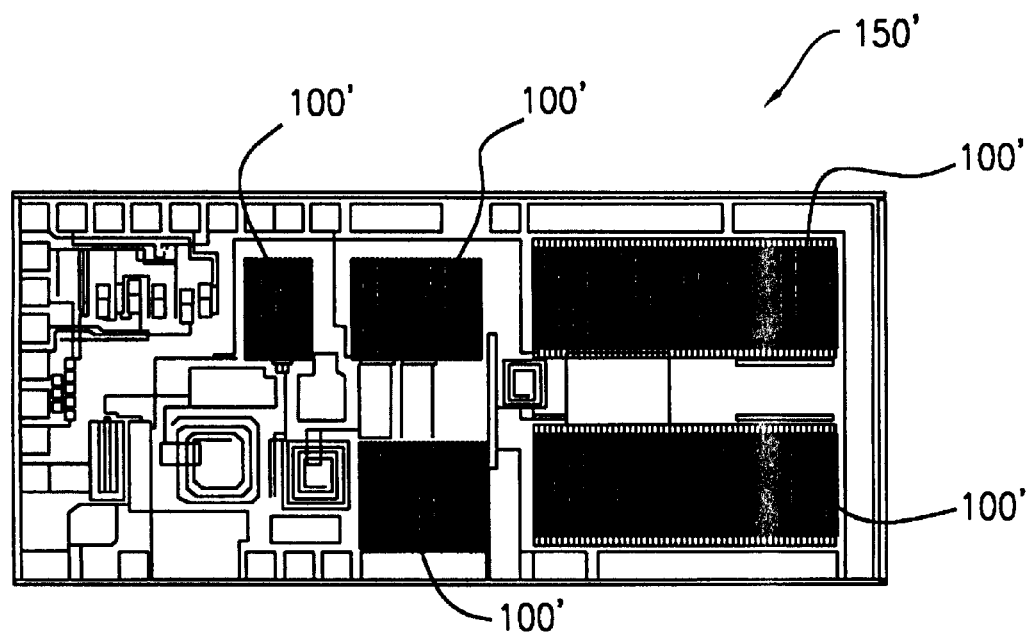
FIG. 9B illustrates an exemplary view of a power amplifier integrated circuit laid out utilizing the prior art FET cell topology.

FIG. 9A illustrates the application of the present FET topology 100 as applied to the design of a 3.6 volt, 3.5 watt radio frequency power amplifier 150 using the global system for mobile (GSM) standard, while FIG. 9B illustrates the integrated circuit power amplifier 150' laid out using the prior art industry standard approach for the layout of the FETs 100'. As one can ascertain, the benefits of the cost reduction through a compaction afforded by the present invention are clearly visible.

The FET topology described herein may be applied to such FET devices as GaAs metal semiconductor field effect transistors (GaAs MESFETs), high electron mobility transistors (HEMTs), pseudo-morphic high electron mobility transistors (p-HEMTs), lateral diffusion metal-oxide semiconductor field effect transistors (LD- MOS FETs), and metal-oxide semiconductor field effect transistors (MOS FETs) and the like.

It should be understood that a person skilled in the art may make many variations and modifications to the embodiment described herein utilizing functionally equivalent elements to those described herein. Any and all such variations or modifications, as well as others which may become apparent to those skilled in the art, are intended to be included within the scope of the invention as defined by the appended claims.

What is claimed is:

1. A field effect transistor (FET) comprising:
   a plurality of drain fingers electrodes, source finger electrodes and gate finger electrodes disposed in an active region of a semiconductor substrate;
   a drain bus disposed outside said active region and electrically connecting said drain finger electrodes to each other;
   a gate bus disposed outside said active region and electrically connecting said gate finger electrodes to each other; and
   a source bus disposed outside said active region and electrically connecting said source finger electrodes to each other;
   wherein said drain finger electrodes are electrically connected to each other via said drain bus without crossing over said source or gate bus, and wherein said gate finger electrodes are spaced apart from one another by a predetermined amount ranging substantially between 8.6 microns ($\mu$m) and 12 $\mu$m.

2. The FET according to claim 1, wherein said gate finger electrodes are interposed between said source and drain fingers.

3. The FET according to claim 1, wherein said source finger electrodes cross over said gate bus.

4. The FET according to claim 1, wherein said source bus is disposed opposite said drain bus.

5. The FET according to claim 4, wherein said gate bus is disposed between said source bus and said drain bus.

6. The FET according to claim 1, wherein through wafer via holes are not provided in said FET.

7. The FET according to claim 3, wherein a portion of said gate bus is disposed beneath said source bus and separated by an insulting region.

8. The FET according to claim 7, wherein said insulating region is a polyimide crossover layer.

9. The FET according to claim 1, wherein source, drain and gate finger electrodes are repetitiously interleaved, wherein each said gate finger electrode is adjacent a corresponding drain finger and source finger electrode.

10. The FET according to claim 1, wherein said FET comprises a single gate FET device.

11. The FET according to claim 1, wherein said gate finger electrode comprises a gate metal layer on which is disposed a first metal layer.

12. The FET according to claim 1, wherein said drain and source finger electrodes each comprise an ohmic metal layer on which is disposed a first metal layer.

13. The FET according to claim 11, wherein said gate finger electrode gate metal layer comprises TiWN and wherein said first metal layer comprises Ti/Ge/Au.

14. The FET according to claim 12, wherein said ohmic metal layer comprises Ni/Ge/Au and wherein said first metal layer comprises Ti/Ge/Au.

15. A field effect transistor (FET) comprising:
   a substrate having an active region at a surface thereof;
   a plurality of drain fingers electrodes, source finger electrodes and gate finger electrodes disposed in said active region and making ohmic contact with said active region;
   a drain bus disposed outside said active region and electrically connecting said drain finger electrodes to each other;
   a source bus disposed outside said active region opposite said drain bus and electrically connecting said source finger electrodes to each other; and
   a gate bus disposed outside said active region between said drain bus and said source bus and electrically connecting said gate finger electrodes to each other;
   wherein said gate finger electrodes are formed of a first metal layer disposed over a TiWN gate metal layer, and
   wherein said drain finger electrodes are electrically connected to each other via said drain bus without crossing over said source or gate finger electrodes, said source finger electrodes cross over said gas bus and wherein said through wafer via holes are not provided in said FET.

16. The FET according to claim 15, wherein said drain finger, source finger, and gate finger electrodes are disposed in said active area in an interdigitated manner.

17. The FET according to claim 15, wherein said source bus comprises a layer of gold plating.

18. The FET according to claim 15, further comprising a polyimide layer disposed between said source finger electrodes and said gate bus.

19. The FET according to claim 15, further comprising an insulating layer disposed over said source, gate and drain finger electrodes.

20. The FET according to claim 19, further comprising:
   a first conductive layer disposed over a portion of said insulating layer which is disposed over said source finger electrodes; and
   a second conductive layer disposed over a portion of said insulating layer which is disposed over said drain finger electrodes.

21. The FET according to claim 20, further comprising via holes formed in said insulating layer for electrically coupling said first conductive layer with said source finger electrodes, and said second conductive layer with said drain finger electrodes.

22. The FET according to claim 19, wherein said insulating layer comprises SiN.

23. The FET according to claim 19, wherein said drain and source finger electrodes are formed of a first metal layer disposed over an ohmic metal layer.

24. A field effect transistor (FET) device comprising:
   a plurality of drain finger electrodes, source finger electrodes and gate finger electrodes disposed in an active region of a semiconductor substrate;
   a drain bus disposed outside said active region and electrically connecting said drain finger electrodes to each other;
   a gate bus disposed outside said active region and electrically connecting said gate finger electrodes to each other wherein said gate finger electrodes are formed of a first metal layer disposed over a TiWN gate metal layer; and
   a source bus disposed outside said active region and electrically connecting said gate finger electrodes to each other;
   wherein said drain finger electrodes are electrically connected to each other via said drain bus without crossing over said source or gate bus, and wherein said through wafer via holes are not provided in said FET.

25. A field effect transistor (FET) device comprising:
   A plurality of drain fingers electrodes, source finger electrodes and gate finger electrodes disposed in an active region of a semiconductor substrate, said gate finger electrodes comprising a gate metal formed of TiWN material on which is disposed a first metal layer formed of Ti/Ge/Au material;
   A drain bus disposed outside said active region and electrically connecting said drain finger electrodes to each other;
   A gate bus disposed outside said active region and electrically said gate finger electrodes to each other; and
   A source bus disposed outside said active region and electrically said gate finger electrodes to each other;
   wherein said drain finger electrodes are electrically connected to each other via said drain bus without crossing over said source or gate bus.

* * * * *